US012491335B2

(12) United States Patent
Burkholz

(10) Patent No.: US 12,491,335 B2
(45) Date of Patent: Dec. 9, 2025

(54) MULTI-LUMEN VASCULAR ACCESS DEVICE AND RELATED METHODS

(71) Applicant: Becton, Dickinson and Company, Franklin Lakes, NJ (US)

(72) Inventor: Jonathan Karl Burkholz, Salt Lake City, UT (US)

(73) Assignee: Becton, Dickinson and Company, Franklin Lakes, NJ (US)

( * ) Notice: Subject to any disclaimer, the term of this patent is extended or adjusted under 35 U.S.C. 154(b) by 721 days.

(21) Appl. No.: 17/195,253

(22) Filed: Mar. 8, 2021

(65) Prior Publication Data

US 2021/0290898 A1 Sep. 23, 2021

Related U.S. Application Data

(60) Provisional application No. 62/993,466, filed on Mar. 23, 2020.

(51) Int. Cl.

| | |
|---|---|
| ***A61M 25/00*** | (2006.01) |
| ***A61B 5/15*** | (2006.01) |
| ***A61M 39/10*** | (2006.01) |

(52) U.S. Cl.

CPC ... *A61M 25/0026* (2013.01); *A61B 5/150221* (2013.01); *A61B 5/150992* (2013.01); *A61M 25/007* (2013.01); *A61M 39/105* (2013.01); *A61M 2039/1077* (2013.01)

(58) Field of Classification Search

CPC ...... A61M 2025/0031; A61M 25/0026; A61M 25/007

See application file for complete search history.

(56) References Cited

U.S. PATENT DOCUMENTS

| | | | |
|---|---|---|---|
| 5,221,255 A | 6/1993 | Mahurkar et al. | |
| 5,405,334 A | 4/1995 | Roth et al. | |
| 2003/0191425 A1 | 10/2003 | Rosenblatt et al. | |
| 2005/0004554 A1 | 1/2005 | Osborne | |
| 2005/0119597 A1* | 6/2005 | O'Mahony ......... | A61M 1/3661 604/4.01 |

(Continued)

FOREIGN PATENT DOCUMENTS

| | | |
|---|---|---|
| CN | 107405159 A | 11/2017 |
| CN | 108348728 A | 7/2018 |

(Continued)

OTHER PUBLICATIONS

Velano Vascular, Inc., Pivo Needleless Blood Draw Solution, Webpage, <https://velanovascular.com/solutions/>(last accessed May 19, 2021).

*Primary Examiner* — Dung T Ulsh

(74) *Attorney, Agent, or Firm* — The Webb Law Firm

(57) ABSTRACT

A vascular access device may include a first lumen, which may include a distal end and a proximal end. The vascular access device may also include a second lumen, which may include a distal end and a proximal end. The distal end of the second lumen may be proximal to the distal end of the first lumen. The vascular access device may include an opening or a valve adjacent to the distal end of the second lumen and providing access to the second lumen. The vascular access device may include a first connector, which may be disposed at a proximal end of the first lumen, and a second connector, which may be disposed at a proximal end of the second lumen.

20 Claims, 15 Drawing Sheets

(56) References Cited

U.S. PATENT DOCUMENTS

| | | | | |
|---|---|---|---|---|
| 2010/0228178 | A1* | 9/2010 | McGraw ............. | A61M 1/3661 604/6.16 |
| 2014/0330220 | A1* | 11/2014 | Zawacki ............. | A61M 1/3659 604/264 |
| 2015/0088100 | A1* | 3/2015 | Oborn ............... | A61M 25/0032 604/523 |
| 2018/0117278 | A1* | 5/2018 | Cameron ............ | A61M 25/007 |
| 2018/0154108 | A1* | 6/2018 | Conia ................. | A61M 31/005 |
| 2019/0021640 | A1 | 1/2019 | Burkholz et al. | |
| 2019/0321590 | A1 | 10/2019 | Burkholz et al. | |
| 2019/0321595 | A1 | 10/2019 | Spataro et al. | |
| 2020/0016374 | A1 | 1/2020 | Burkholz et al. | |
| 2020/0170559 | A1 | 6/2020 | Burkholz et al. | |
| 2020/0230353 | A1 | 7/2020 | Burkholz et al. | |
| 2020/0316346 | A1 | 10/2020 | Burkholz et al. | |

FOREIGN PATENT DOCUMENTS

| | | | |
|---|---|---|---|
| CN | 215900664 | U | 2/2022 |
| JP | 2005521525 | A | 7/2005 |
| WO | 0074760 | A2 | 12/2000 |
| WO | 03084596 | A1 | 10/2003 |
| WO | 2004020019 | A2 | 3/2004 |
| WO | 2004075962 | A2 | 9/2004 |
| WO | 2005004966 | A1 | 1/2005 |
| WO | 2005035022 | A2 | 4/2005 |
| WO | 2006002103 | A2 | 1/2006 |
| WO | 2009003044 | A1 | 12/2008 |

* cited by examiner

MULTI-LUMEN VASCULAR ACCESS DEVICE AND RELATED METHODS

RELATED APPLICATIONS

This application claims the benefit of U.S. Provisional Patent Application No. 62/993,466, filed on Mar. 23, 2020, entitled "MULTI-LUMEN VASCULAR ACCESS DEVICE AND RELATED METHODS," which is incorporated herein in its entirety.

BACKGROUND

A vascular access device, such as a catheter, is commonly used to infuse fluids into vasculature of a patient. For example, the vascular access device may be used for infusing normal saline solution, various medicaments, or total parenteral nutrition. The vascular access device may also be used for withdrawing blood from the patient. However, infusion of saline solution, various medicaments, or total parenteral nutrition is stopped prior to withdrawing the blood from the patient and collecting a blood sample. Thus, there may be a delay in delivering needed fluids to the patient or a clinician may access the vasculature of the patient with an additional needle stick, which may result in harm to the patient.

Repeated access to the vascular access device to withdraw blood may increase a risk of introducing microbes into the vascular access device and infection. Repeated access to the vascular access device to withdraw blood may also increase a risk of thrombus and occlusion within a lumen of the vascular access device due to blood being flowing through the vascular access device without thorough and proper flushing of the vascular access device.

The subject matter claimed herein is not limited to embodiments that solve any disadvantages or that operate only in environments such as those described above. Rather, this background is only provided to illustrate one example technology area where some implementations described herein may be practiced.

SUMMARY

The present disclosure relates generally to vascular access devices and related systems and methods. In particular, the present disclosure relates to multi-lumen vascular access devices and related systems and methods. In some embodiments, a vascular access device may include a first lumen, which may include a distal end and a proximal end. In some embodiments, the vascular access device may include a second lumen, which may include a distal end and a proximal end. In some embodiments, the distal end of the second lumen may be proximal to the distal end of the first lumen. In some embodiments, the vascular access device may include an opening or a valve adjacent to the distal end of the second lumen.

In some embodiments, the vascular access device may include a first connector disposed at the proximal end of the first lumen. In some embodiments, the vascular access device may include a second connector disposed at the proximal end of the second lumen. In some embodiments, the vascular access device may include a catheter adapter, which may include a distal end, a proximal end, and a divider extending between the distal end of the catheter adapter and the proximal end of the catheter adapter. In some embodiments, the divider may separate the first lumen and the second lumen within the catheter adapter. In some embodiments, the first lumen and the second lumen within the catheter adapter may be concentric. In these and other embodiments, the divider may be tubular. In some embodiments, the first lumen and the second lumen may be side by side.

In some embodiments, the vascular access device may include a first extension tube extending from the proximal end of the catheter adapter to the first connector. In some embodiments, the vascular access device may include a second extension tube extending from the proximal end of the catheter adapter to the second connector. In some embodiments, the vascular access device may include a catheter extending from the proximal end of the catheter adapter. In some embodiments, the catheter may include a peripheral intravenous catheter, a peripherally-inserted central catheter, or a midline catheter. In some embodiments, a distal end of the catheter may include one or more side holes.

In some embodiments, the first extension tube and an entire length of the catheter may include the first lumen. In some embodiments, the second extension tube and a proximal portion of the catheter may include the second lumen. In some embodiments, the divider may extend through the proximal portion of the catheter. In some embodiments, the first lumen and the second lumen may be side by side within the catheter adapter and the proximal portion.

In some embodiments, the vascular access device may include a blood collection device coupled to the second connector. In some embodiments, the blood collection device may include a tube extending through the second lumen and out the opening or the valve. In some embodiments, the vascular access device may include multiple openings or multiple valves. In some embodiments, the multiple openings or the multiple valves may be adjacent to the distal end of the second lumen.

In some embodiments, the vascular access device may include a third lumen, which may include a distal end and a proximal end. In some embodiments, the distal end of the second lumen may be proximal to the distal end of the first lumen and the distal end of the third lumen. In some embodiments, the vascular access device may include a third connector disposed at the proximal end of the third lumen. In some embodiments, the first lumen, the second lumen, and the third lumen may be side by side.

In some embodiments, the divider may be a first divider. In some embodiments, the vascular access device may include a second divider extending between the distal end of the catheter adapter and the proximal end of the catheter adapter. In some embodiments, the first divider and the second divider may separate the first lumen, the second lumen, and the third lumen within the catheter adapter. In some embodiments, the vascular access device may include a third extension tube extending from the proximal end of the catheter adapter to the third connector. In some embodiments, the third extension tube and an entire length of the catheter may include the third lumen.

In some embodiments, a method may include inserting the vascular access device into vasculature of a patient. In some embodiments, the method may include collecting blood from the vasculature through the second lumen. In some embodiments, the method may include infusing fluid into the vasculature through the first lumen at a same time as collecting the blood from the vasculature through the second lumen.

In some embodiments, the vascular access device may include the valve adjacent to the distal end of the first lumen. In these and other embodiments, collecting the blood from the vasculature through the second lumen may include coupling an evacuated blood collection container to the second connector. In some embodiments, in response to coupling the evacuated blood collection container to the second connector, the valve may open.

In some embodiments, collecting the blood from the vasculature through the second lumen may include coupling a blood collection device coupled to the second connector. In some embodiments, the blood collection device may include an instrument. In some embodiments, the instrument may include a tube, a guidewire, a wire, an obturator, a probe, a sensor, or any other suitable instrument. In these and other embodiments, coupling the blood collection device to the second connector may include inserting the instrument through the second lumen and out the opening or the valve. In some embodiments, the method may include infusing another fluid into the vasculature through the third lumen at a same time as infusing the fluid into the vasculature through the first lumen and collecting the blood from the vasculature through the second lumen.

It is to be understood that both the foregoing general description and the following detailed description are exemplary and explanatory and are not restrictive, as claimed. It should be understood that the various embodiments are not limited to the arrangements and instrumentality shown in the drawings. It should also be understood that the embodiments may be combined, or that other embodiments may be utilized and that structural changes, unless so claimed, may be made without departing from the scope of the various embodiments of the present disclosure. The following detailed description is, therefore, not to be taken in a limiting sense.

BRIEF DESCRIPTION OF THE SEVERAL VIEWS OF THE DRAWINGS

Example embodiments will be described and explained with additional specificity and detail through the use of the accompanying drawings in which.

DESCRIPTION OF EMBODIMENTS

Figure 1A:
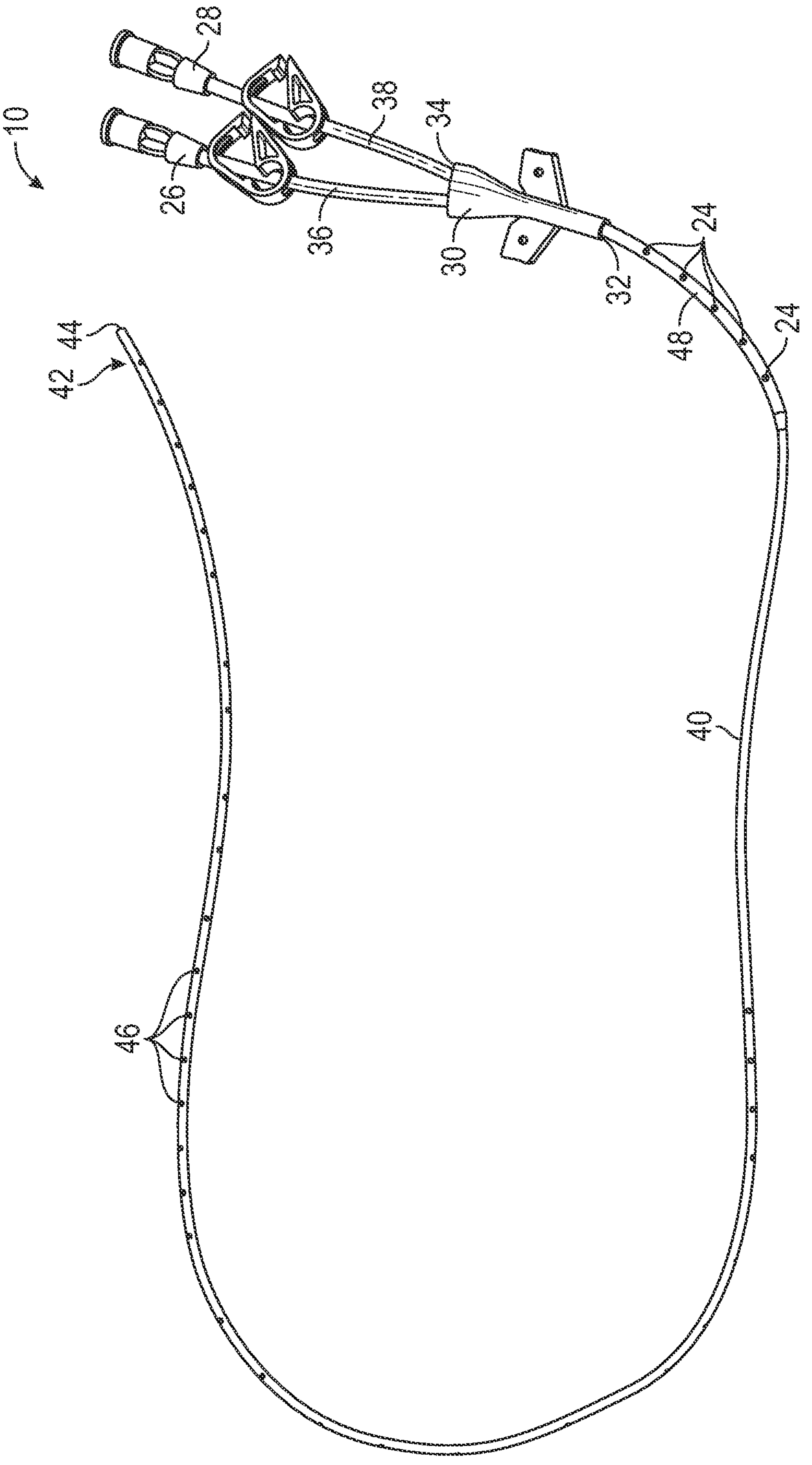
FIG. 1A is an upper perspective view of an example vascular access device, according to some embodiments.
Figure 1B:
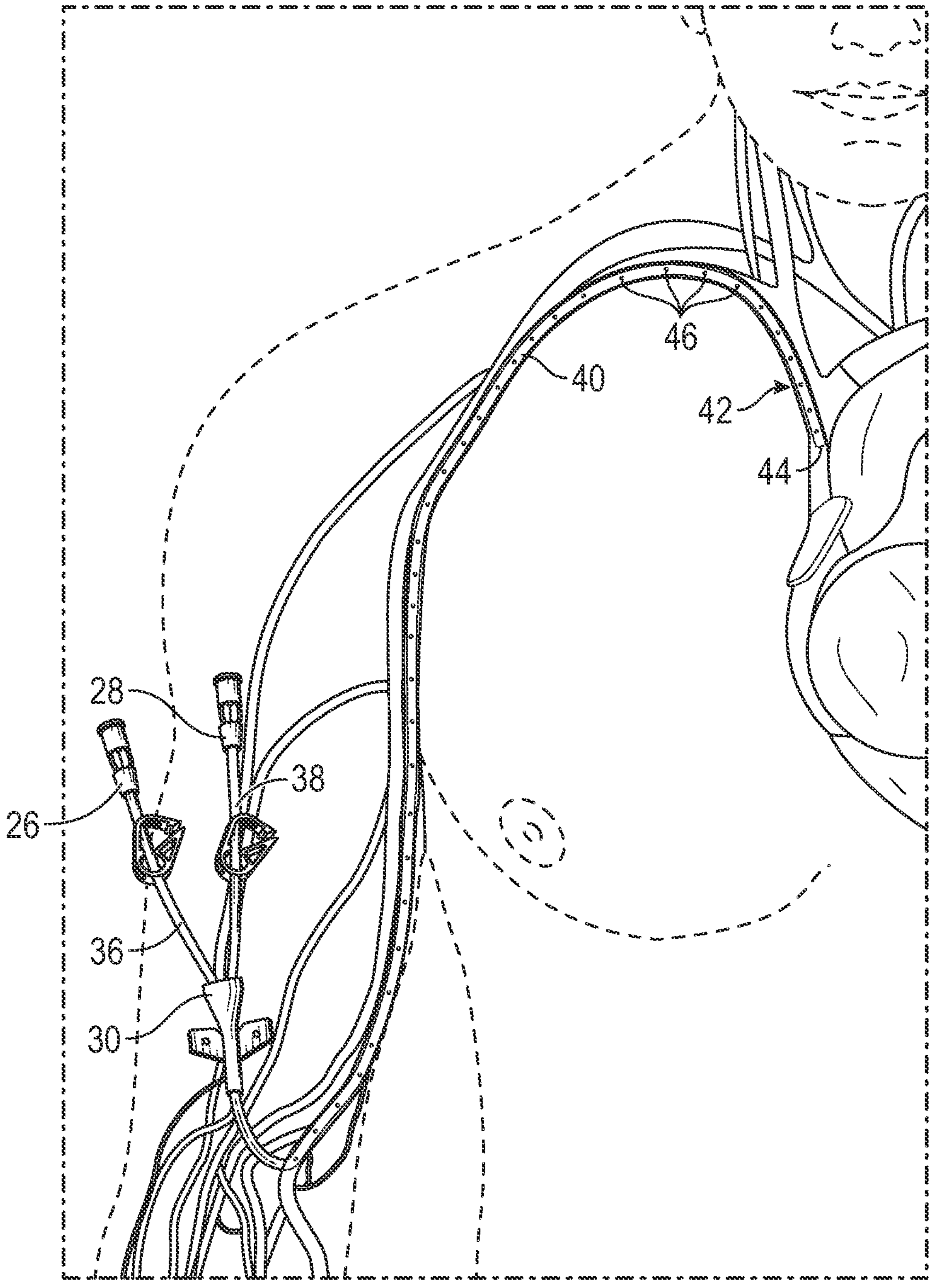
FIG. 1B is a schematic diagram illustrating the vascular access device of FIG. 1A inserted into vasculature of a patient, according to some embodiments.
Figure 1C:
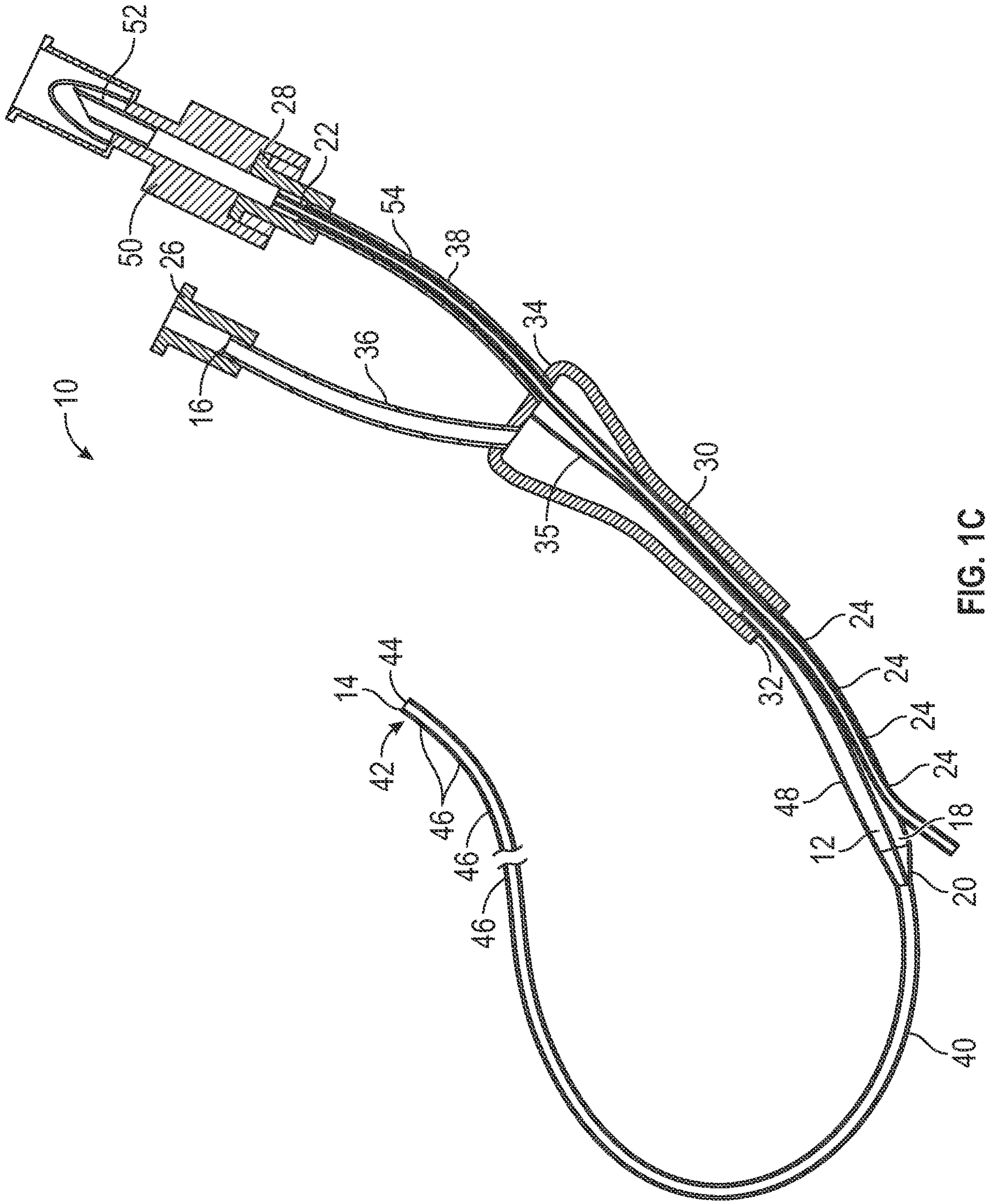
FIG. 1C is a cross-sectional view of the vascular access device of FIG. 1A, illustrating an example blood collection device coupled to an example connector, according to some embodiments.

Referring now to FIGS. 1A-1C, a vascular access device 10 is illustrated, according to some embodiments. In some embodiments, the vascular access device 10 may include a first lumen 12, which may include a distal end 14 and a proximal end 16. In some embodiments, the vascular access device 10 may include a second lumen 18, which may include a distal end 20 and a proximal end 22. In some embodiments, the distal end 20 of the second lumen 18 may be proximal to the distal end 14 of the first lumen 12. In some embodiments, the second lumen 18 may terminate closer to the distal end 14 of the first lumen 12 when the catheter 40 is a midline catheter as opposed to a peripherally-inserted central catheter.

In some embodiments, the vascular access device 10 may include an opening 24 or a valve, which may be adjacent to the distal end 20 of the second lumen 18. In some embodiments, the vascular access device 10 may include multiple openings 24 or multiple valves, which may be disposed along the second lumen 18.

In some embodiments, the vascular access device 10 may include a first connector 26 disposed at the proximal end 16 of the first lumen 12. In some embodiments, the vascular access device 10 may include a second connector 28 disposed at the proximal end 22 of the second lumen 18. In some embodiments, the first connector 26 and/or the second connector 28 may include a male or female luer adapter. In some embodiments, a needleless access connector (not illustrated) may be coupled to the first connector 26 and/or the second connector 28. In some embodiments, the first connector 26 may include color and/or markings different from the second connector 28, which may facilitate differentiation of the first lumen 12 and the second lumen 18 by the clinician. In some embodiments, the first extension tube 36 may include color and/or markings different from the second extension tube 38, which may facilitate differentiation of the first lumen 12 and the second lumen 18 by the clinician. In some embodiments, the needleless access connector may include an anti-reflux or positive displacement connector.

In some embodiments, the vascular access device 10 may include a catheter adapter 30, which may include a distal end 32 and a proximal end 34. In some embodiments, the vascular access device 10 may include a divider 35, which may extend between the distal end 32 of the catheter adapter 30 and the proximal end 34 of the catheter adapter 30. In some embodiments, the divider 35 may separate the first lumen 12 and the second lumen 18 within the catheter adapter 30. In some embodiments, the first lumen 12 and the second lumen 18 may be side by side, as illustrated, for example, in FIG. 1C.

In some embodiments, the vascular access device 10 may include a first extension tube 36, which may extend from the proximal end 34 of the catheter adapter 30 to the first connector 26. In some embodiments, the vascular access device 10 may include a second extension tube 38, which may extend from the proximal end 34 of the catheter adapter 30 to the second connector 28. In some embodiments, the vascular access device 10 may include a catheter 40 extending from the proximal end 34 of the catheter adapter 30. In some embodiments, the catheter 40 may include a peripheral intravenous catheter, a peripherally-inserted central catheter, or a midline catheter. In some embodiments, a distal end 42 of the catheter 40 may include a distal opening 44 and/or one or more valves or one or more side holes 46. In some embodiments, a proximal end of the catheter 40 may be secured within the catheter adapter 30.

In some embodiments, the first extension tube 36 and an entire length of the catheter 40 may include the first lumen 12. In some embodiments, the second extension tube 38 and a proximal portion 48 of the catheter 40 may include the second lumen 18. In some embodiments, the catheter 40 may include a portion of the divider 35, which may extend through the proximal portion 48 of the catheter 40. In some embodiments, the first lumen 12 and the second lumen 18 may be side by side within the catheter adapter 30 and the proximal portion 48. In some embodiments, the first extension tube 36 may include a clamp, which may prevent blood from flowing through the first lumen 12 in response to the clamp being in a closed position. In some embodiments, the second extension tube 38 may include a clamp, which may prevent blood from flowing through the second lumen 18 in response to the clamp being in a closed position. In some embodiments, the clamp on the first extension tube 36 may include color and/or markings different from the second extension tube 38 and/or the clamp on the second extension tube 38, which may facilitate differentiation of the first lumen 12 and the second lumen 18 by the clinician.

In some embodiments, the vascular access device 10 may include a blood collection device 50, which may be coupled to the second connector 28 and/or in fluid communication with the second lumen 18. In some embodiments, the blood collection device 50 may be directly coupled to the second connector 28. In some embodiments, the blood collection device 50 may be coupled to the second connector 28 via the needleless connector. In some embodiments, the blood collection device 50 may include an instrument 54 extending through the second lumen 18 and out the opening 24 or the valve. In some embodiments, the instrument 54 may include a tube, a guidewire, a wire, an obturator, a probe, a sensor, or any other suitable instrument. In some embodiments, the multiple openings 24 or the multiple valves may be adjacent to the distal end 20 of the second lumen 18.

In some embodiments, the blood collection device 50 may include or correspond to a blood collection container. In some embodiments, the blood collection container may include a syringe, an evacuated blood collection tube, a small sample collection device, or any other container. In some embodiments, the blood collection device 50 may include VACUTAINER© or a VACUTAINER© LUER-LOK™, available from Becton Dickinson and Company of Franklin Lakes, New Jersey, which may be configured to receive the blood collection container. In some embodiments, the blood collection device 50 may include a needle 52, which may be configured to insert into the blood collection container. In some embodiments, the needle 52 may be disposed within an elastomeric sheath. In some embodiments, in response to the blood collection container pushing the elastomeric sheath distally, the needle 52 may pierce the elastomeric sheath and be inserted into the blood collection container.

In some embodiments, the vascular access device 10 may facilitate acquisition of a blood sample from the second lumen 18 and not through the first lumen 12. Thus, in some embodiments, the blood sample may be acquired via a lumen dedicated to blood collection. In some embodiments, blood collection through the second lumen 18 may be used for blood collection to reduce a risk of thrombus development within the vascular access device 10 and to reduce a risk of introduction of microbes and other complications associated with repeated blood collection from a vascular access device such as a catheter. In some embodiments, the second lumen 18 may provide access to the blood collection device 50 and/or may facilitate an ability to draw blood into the vascular access device 10 through the opening 24 and/or the valve.

In some embodiments, the blood sample may be collected directly from the second lumen 18. For example, blood may flow through the opening 24 and/or the valve and into the second lumen 18. The blood may then flow proximally through the second lumen 18, through the second connector 28, and into the blood collection device 50. In some embodiments, in response to aspiration of the second lumen 18, blood may be pulled into the second lumen 18 and the blood collection device 50, and the first lumen 12 may be unaffected.

In some embodiments, the vascular access device 10 may facilitate positioning of the second lumen 18 within a large vein that has favorable catheter-to-vein ratio and blood flow. Thus, the vascular access device 10 may facilitate a high success rate of collecting a desired blood volume without introducing complications associated with high catheter-to-vein ratios. In some embodiments, in response to the vascular access device 10 being placed in an upper arm of the patient, blood may be acquired from a larger vein with better blood flow and availability than a vein generally accessed by a peripheral intravenous catheter. In some embodiments, the second lumen 18 may be used to administer medications far away from the distal end 14 of the first lumen 12, which may reduce concern over potential incompatible medications.

In some embodiments, a method may include inserting the vascular access device 10 into the vasculature of the patient, as illustrated, for example, in FIG. 1B. In some embodiments, the method may include collecting blood from the vasculature through the second lumen 18. In some embodiments, the method may include infusing fluid into the vasculature through the first lumen 12 at a same time as collecting the blood from the vasculature through the second lumen 18.

Referring now to FIGS. 1C-1G, in some embodiments, the blood collection device 50 may include an instrument 54. In some embodiments, the blood collection device 50 may be coupled to the second connector 28 and/or extend through the second lumen 18 and out the opening 24 or the valve. Thus, the instrument 54 may access the vasculature 55, as illustrated, for example, in FIG. 1G, and blood may flow through the instrument 54 for collection. In some embodiments, another suitable instrument, such as a probe, may extend through the second lumen 18 and out the opening 24 or the valve. In some embodiments, the vascular access device 10 facilitates access of a large vein with good blood flow, which reduces a likelihood of trauma from the instrument 54 because there is more room for the instrument 54 to advance into a vein without scrapping along a vein wall.

In some embodiments, collecting the blood from the vasculature through the second lumen 18 may include coupling the blood collection device to the second connector 28. In some embodiments, the blood collection device may include the instrument 54. In these and other embodiments, coupling the blood collection device to the second connector 28 may include inserting the instrument 54 through the second lumen 18 and out the opening 24 or the valve.

Figure 1D:
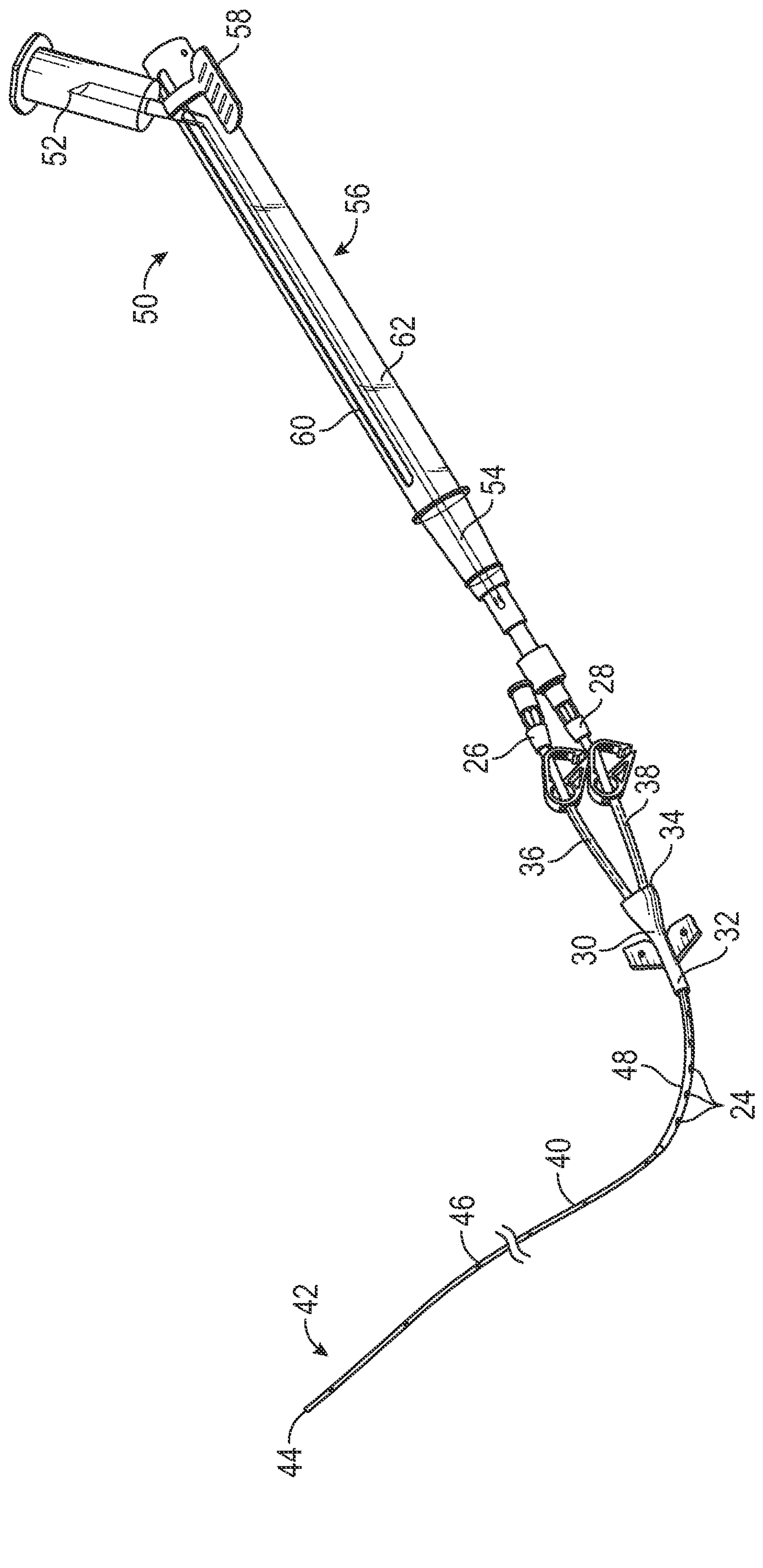
FIG. 1D is an upper perspective view of the vascular access device of FIG. 1A, illustrating another example blood collection device coupled to the connector and in a retracted position, according to some embodiments.
Figure 1E:
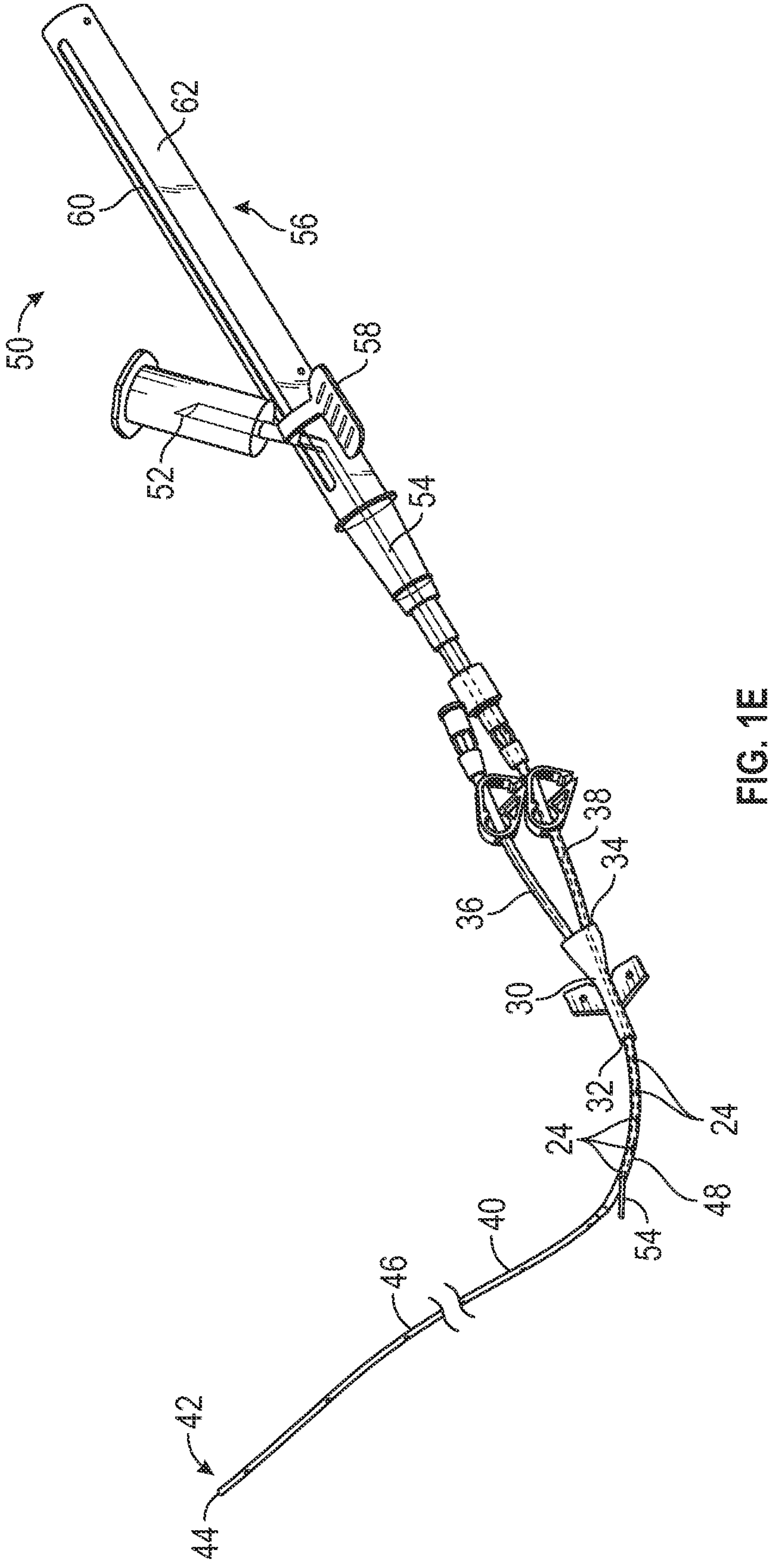
FIG. 1E is an upper perspective view of the vascular access device of FIG. 1A, illustrating the other blood collection device coupled to the connector and in an advanced position, according to some embodiments.
Figure 1F:
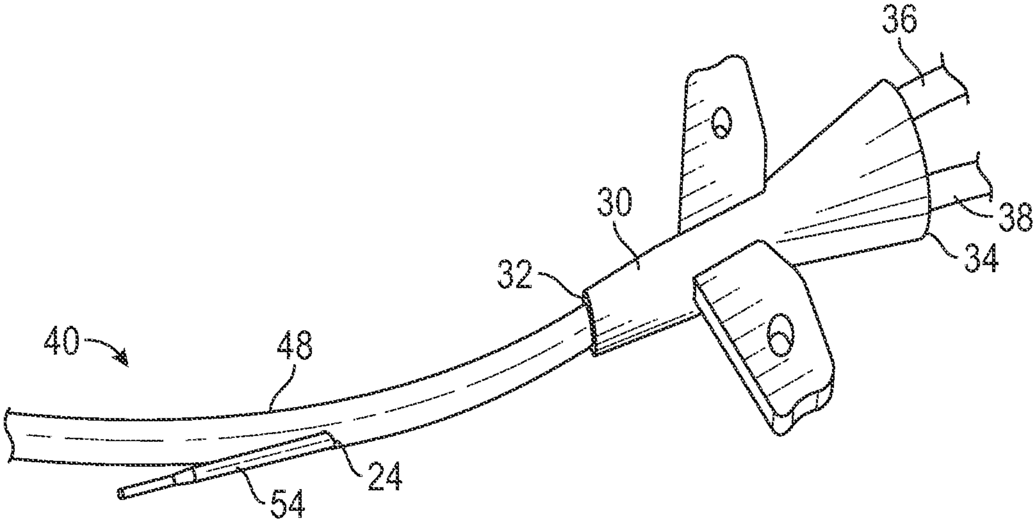
FIG. 1F is an upper perspective view of a portion of the vascular access device of FIG. 1A, illustrating an example instrument extending through an example opening, according to some embodiments.
Figure 1G:
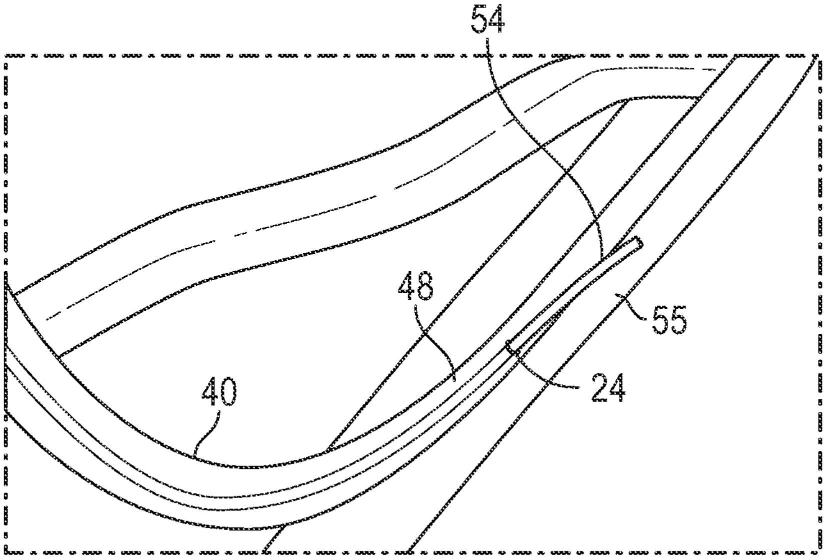
FIG. 1G is a schematic view of the vascular access device of FIG. 1A, illustrating the instrument extending through the opening and into the vasculature of the patient, according to some embodiments.
Figure 2A:
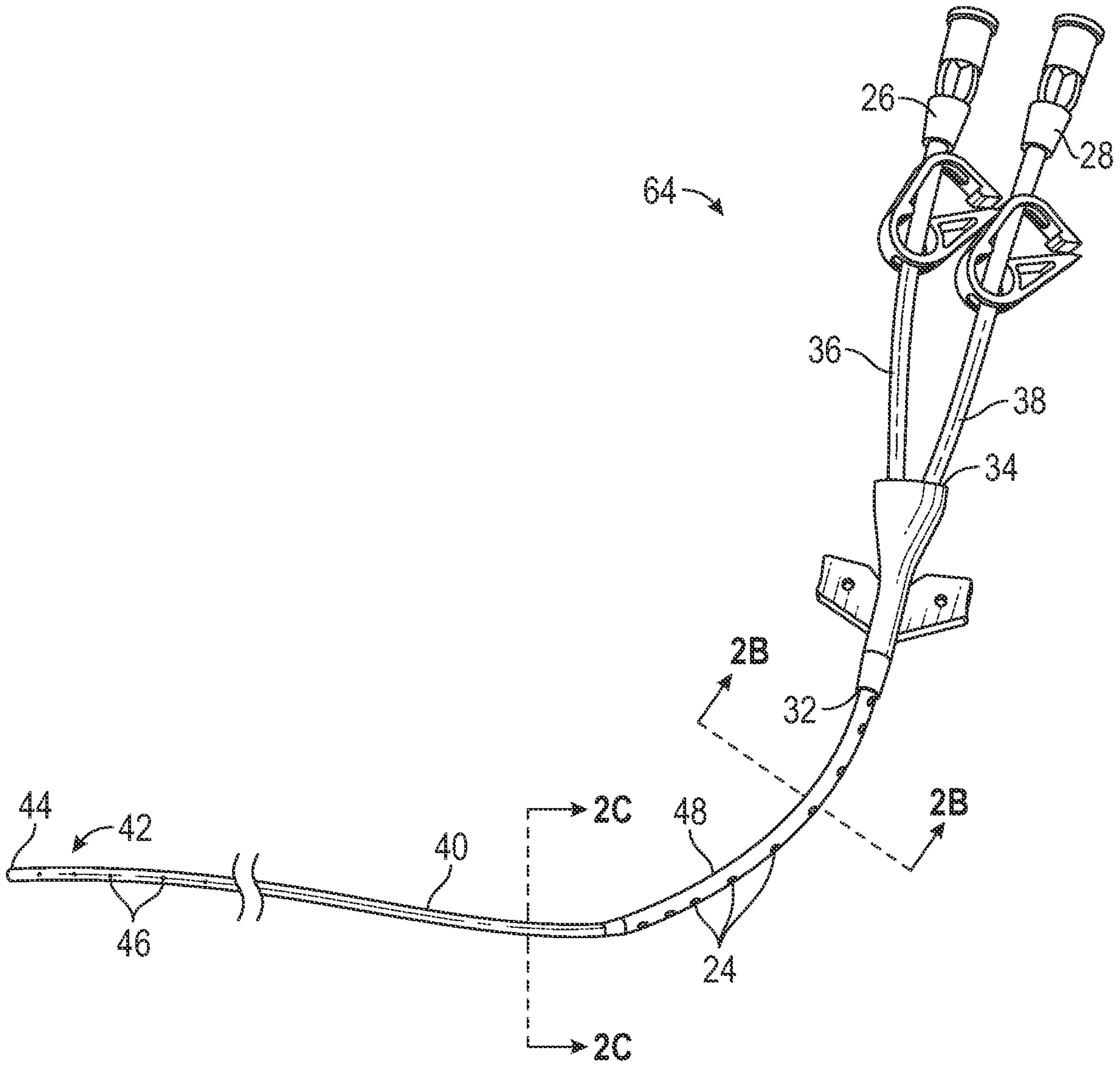
FIG. 2A is an upper perspective view of another example vascular access device, according to some embodiments.
Figure 2B:
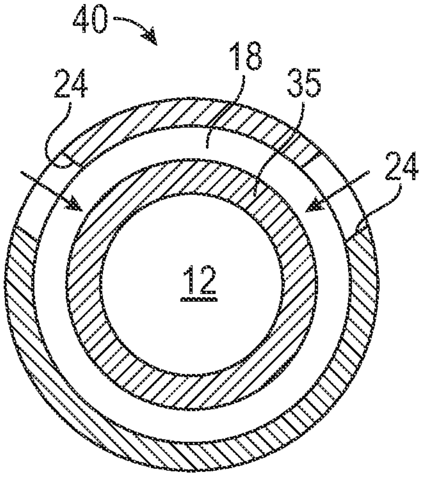
FIG. 2B is a cross-sectional view of the vascular access device of FIG. 2A along a line 2B-2B of FIG. 2A, according to some embodiments.
Figure 2C:
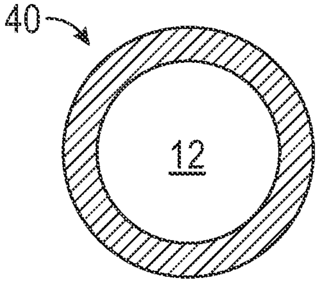
FIG. 2C is a cross-sectional view of the vascular access device of FIG. 2A along a line 2C-2C of FIG. 2A, according to some embodiments.
Figure 2D:
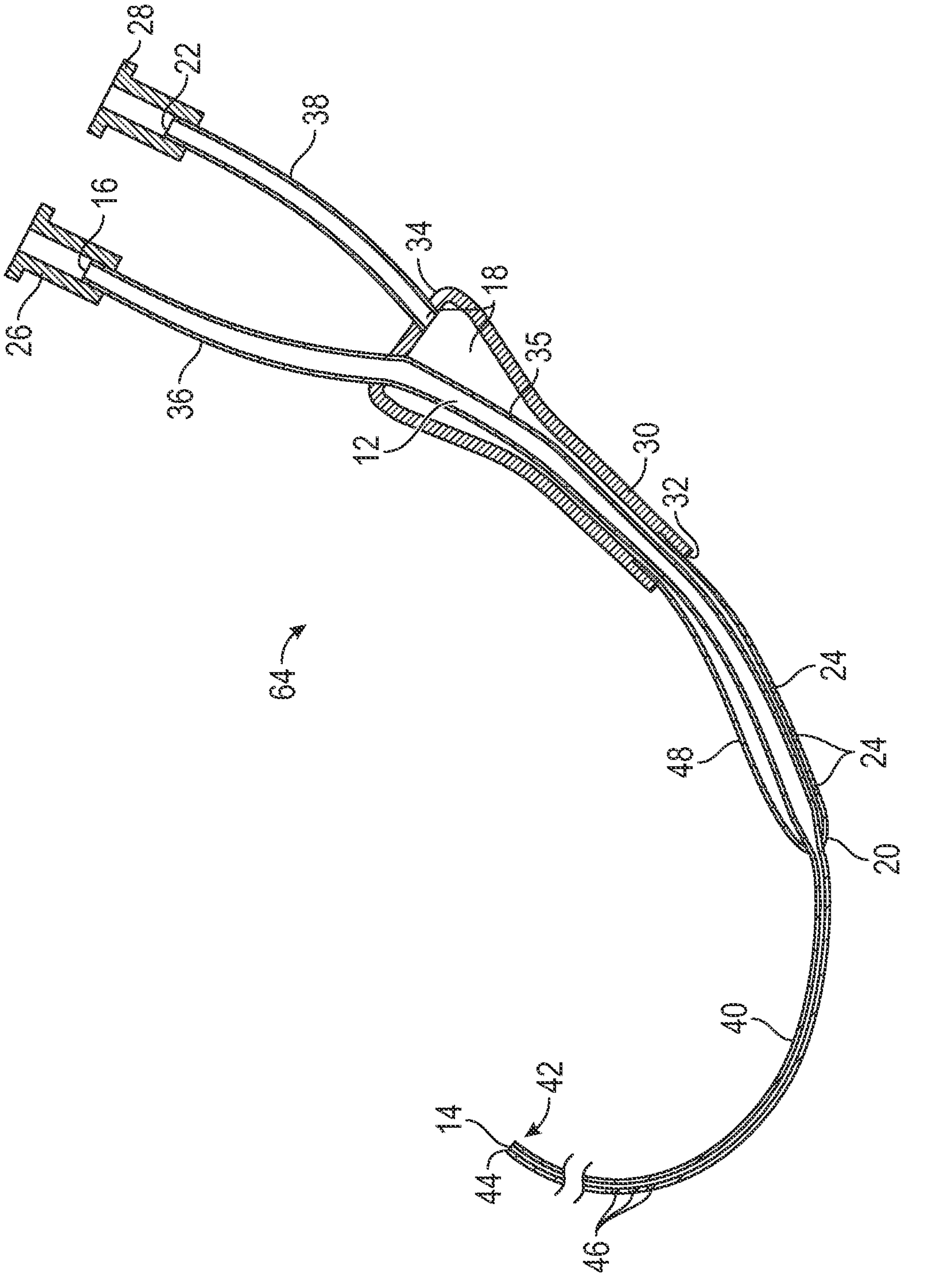
FIG. 2D is a cross-sectional view of the vascular access device of FIG. 2A, according to some embodiments.
Figure 3A:
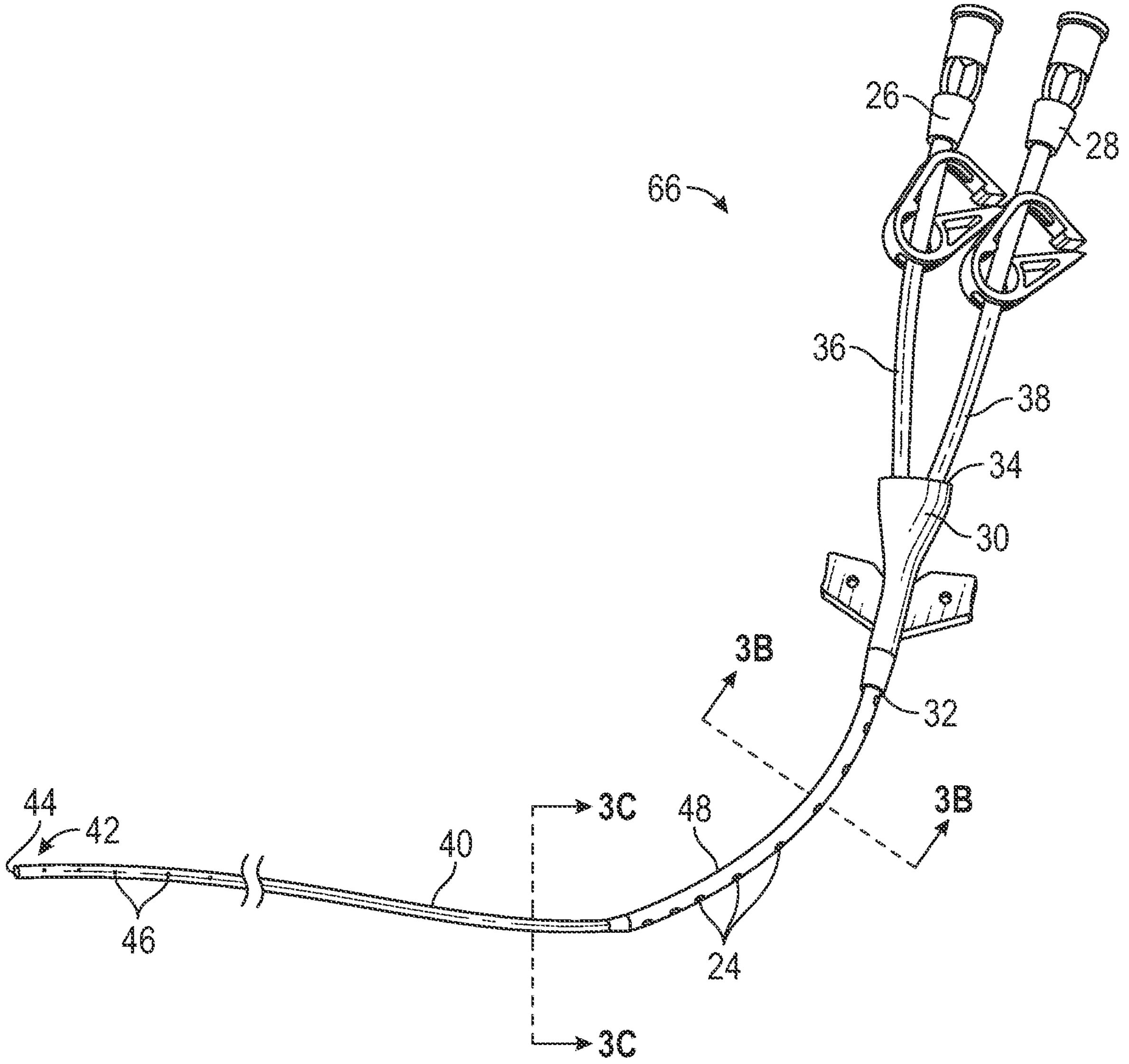
FIG. 3A is an upper perspective view of another example vascular access device, according to some embodiments.
Figure 3B:
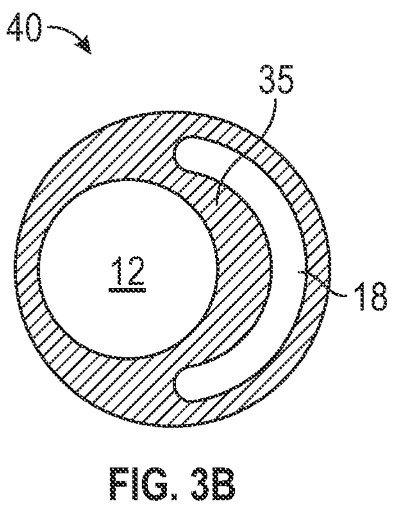
FIG. 3B is a cross-sectional view of the vascular access device of FIG. 3A along a line 3B-3B of FIG. 3A, according to some embodiments.
Figure 3C:
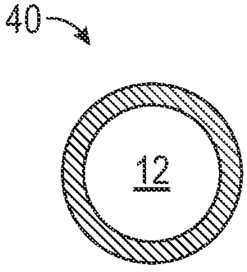
FIG. 3C is a cross-sectional view of the vascular access device of FIG. 3A along a line 3C-3C of FIG. 3A, according to some embodiments.
Figure 3D:
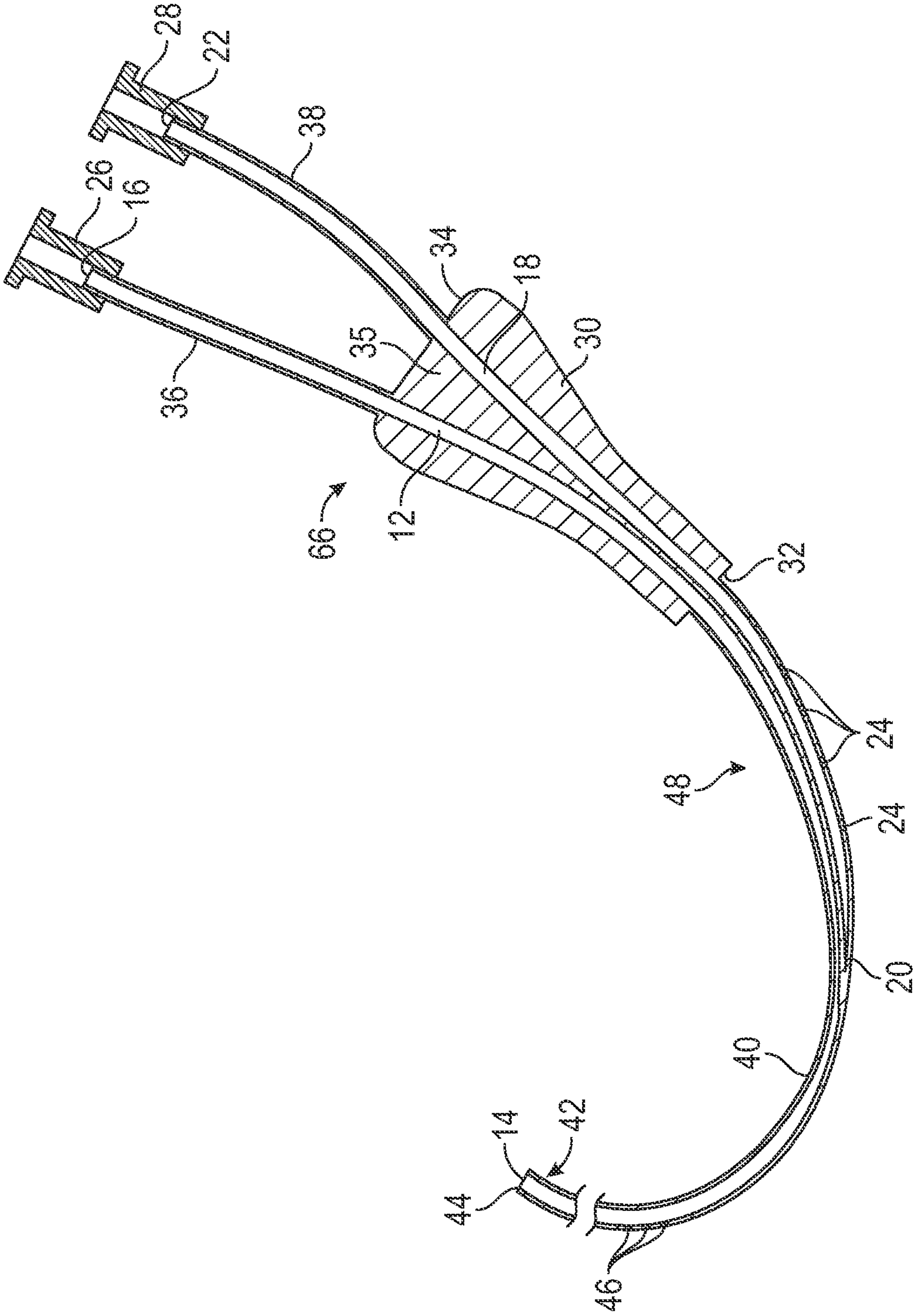
FIG. 3D is a cross-sectional view of the vascular access device of FIG. 3A, according to some embodiments.
Figure 3E:
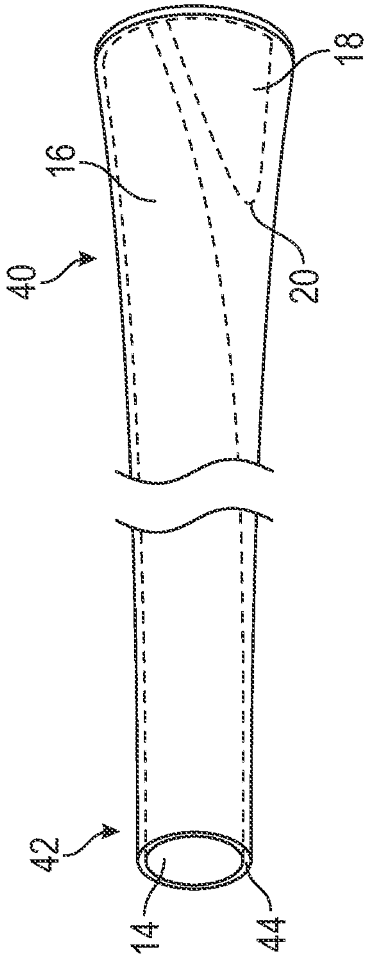
FIG. 3E is an upper perspective view of a portion of the vascular access device of FIG. 3A, according to some embodiments.

As illustrated in FIGS. 1D-1E, in some embodiments, the blood collection device 50 may include a delivery device 56. In some embodiments, the instrument 54 may be delivered through the second lumen 18 and out the opening 24 or the valve via the delivery device 56. In some embodiments, the delivery device 56 may include an advancement element 58. In some embodiments, the advancement element 58 may include a tab or a grip, which may be moved by the clinician to advance the instrument 54 in a distal direction and/or retract the instrument 54 in a proximal direction. In some embodiments, the advancement element 58 may be coupled to instrument 54. In some embodiments, the advancement element 58 may be slidable along a slot 60 disposed within a housing 62.

In some embodiments, the delivery device 56 may include any suitable delivery device and may be further described, for example, in U.S. patent application Ser. No. 16/037,246, filed Jul. 17, 2018, entitled "EXTENSION HOUSING A PROBE OR INTRAVENOUS CATHETER," U.S. patent application Ser. No. 16/388,650, filed Apr. 18, 2019, entitled "INSTRUMENT DELIVERY DEVICE HAVING A ROTARY ELEMENT," U.S. patent application Ser. No. 16/037,319, filed Jul. 17, 2018, entitled "MULTI-DIAMETER CATHETER AND RELATED DEVICES AND METHODS," U.S. patent application Ser. No. 16/502,541, filed Jul. 3, 2019, entitled "DELIVERY DEVICE FOR A VASCULAR ACCESS INSTRUMENT," U.S. patent application Ser. No. 16/691,217, filed Nov. 21, 2019, entitled "SYRINGE-BASED DELIVERY DEVICE FOR A VASCULAR ACCESS INSTRUMENT," U.S. patent application Ser. No. 16/742,013, filed Jan. 14, 2020, entitled "CATHETER DELIVERY DEVICE AND RELATED SYSTEMS AND METHODS," and U.S. patent application Ser. No. 16/838,831, filed Apr. 2, 2020, entitled "VASCULAR ACCESS INSTRUMENT HAVING A FLUID PERMEABLE STRUCTURE, AND RELATED DEVICES AND METHODS," which are each incorporated by reference in their entirety.

Referring now to FIGS. 2A-2D, a vascular access device 64 is illustrated, according to some embodiments. In some embodiments, the vascular access device 64 may be similar or identical to the vascular access device 10 of FIGS. 1A-1G in terms of one or more features and/or operation. In some embodiments, the first lumen 12 and the second lumen 18 within the catheter adapter 30 and/or the proximal portion 48 may be concentric. In these and other embodiments, the divider 35 may be tubular. In some embodiments, the divider 35 may be integrally formed or monolithically formed as a single unit with the first extension tube 36. In some embodiments, the divider 35 may be integrally formed or monolithically formed as a single unit with the catheter adapter 30.

In some embodiments, the second lumen 18 may include an annular space that may taper or abruptly end proximal to the distal end 14 of the first lumen 12. In some embodiments, one or more of the openings 24 or one or more of the valves may extend through a wall of the catheter 40 to provide fluid communication between the second lumen 18 and the vasculature. In some embodiments, the second lumen 18 may surround the first lumen 12 and/or may be disposed laterally to the first lumen 12, which may allow easy access of the instrument 54 to the vasculature.

Referring now to FIGS. 3A-3E, a vascular access device 66 is illustrated, according to some embodiments. In some embodiments, the vascular access device 66 may be similar or identical to the vascular access device 10 of FIGS. 1A-1G in terms of one or more features and/or operation. In some embodiments, the first lumen 12 and the second lumen 18 may be side by side within the catheter adapter 30 and/or the proximal portion 48.

In some embodiments, the second lumen 18 may taper or abruptly end proximal to the distal end 14 of the first lumen 12. In some embodiments, one or more of the openings 24 and/or one or more of the valves may extend through a wall of the catheter 40 to provide fluid communication between the second lumen 18 and the vasculature. In some embodiments, the openings 24 or the valves may be arranged in a pattern along all or a portion of a length of the catheter 40. In some embodiments, the openings 24 and/or the valves may be arranged, for example, in a linear pattern along a longitudinal axis of the catheter 40 or radially around the catheter 40. In some embodiments, the second lumen 18 may be disposed laterally to the first lumen 12, which may allow easy access of the instrument 54 to the vasculature.

Figure 4:
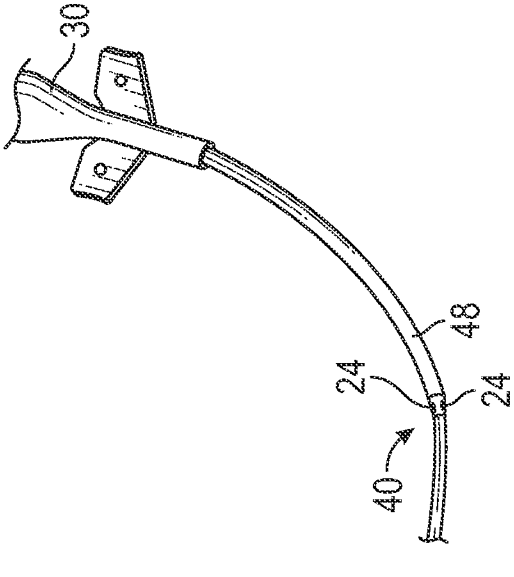
FIG. 4A is an upper perspective view of an example proximal portion of a catheter, according to some embodiments.
FIG. 4B is an upper perspective view of another proximal portion of a catheter, according to some embodiments.
FIG. 4C is an upper perspective view of another proximal portion of a catheter, according to some embodiments.
FIG. 4D is an upper perspective view of an example valve, according to some embodiments.
FIG. 4E is an upper perspective view of the valve of FIG. 4D, illustrating the valve in an open position, according to some embodiments.
Figure 4B:
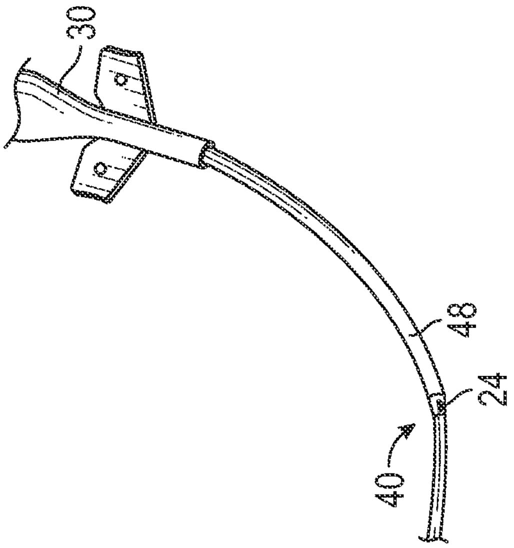
Figure 4C:
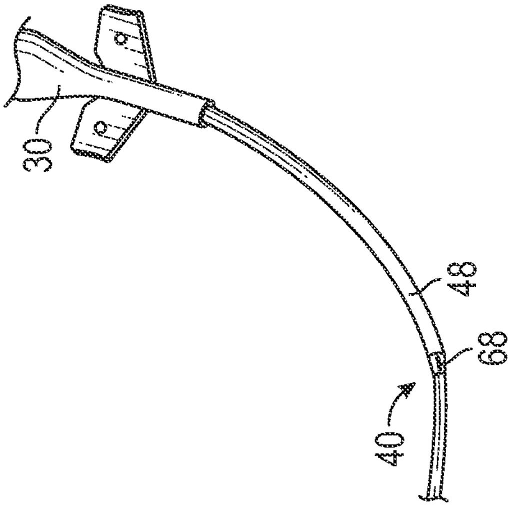

Referring now to FIGS. 4A-4C, the proximal portion 48 of the catheter 40 may include multiple openings 24 (see, for example, FIG. 4A), a single opening 24 (see, for example, FIG. 4B), or a valve 68 (see, for example, FIG. 4C). In some embodiments, the multiple openings 24 may provide multiple fluid paths for blood to enter the second lumen 18, which may facilitate blood draw success by preventing occlusion when a particular one or the multiple openings 24 is against a vein wall or blocked by thrombus or other means.

Figure 4D:
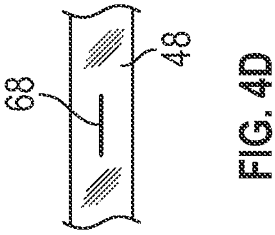
Figure 4E:
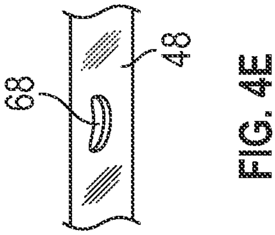
Figure 5A:
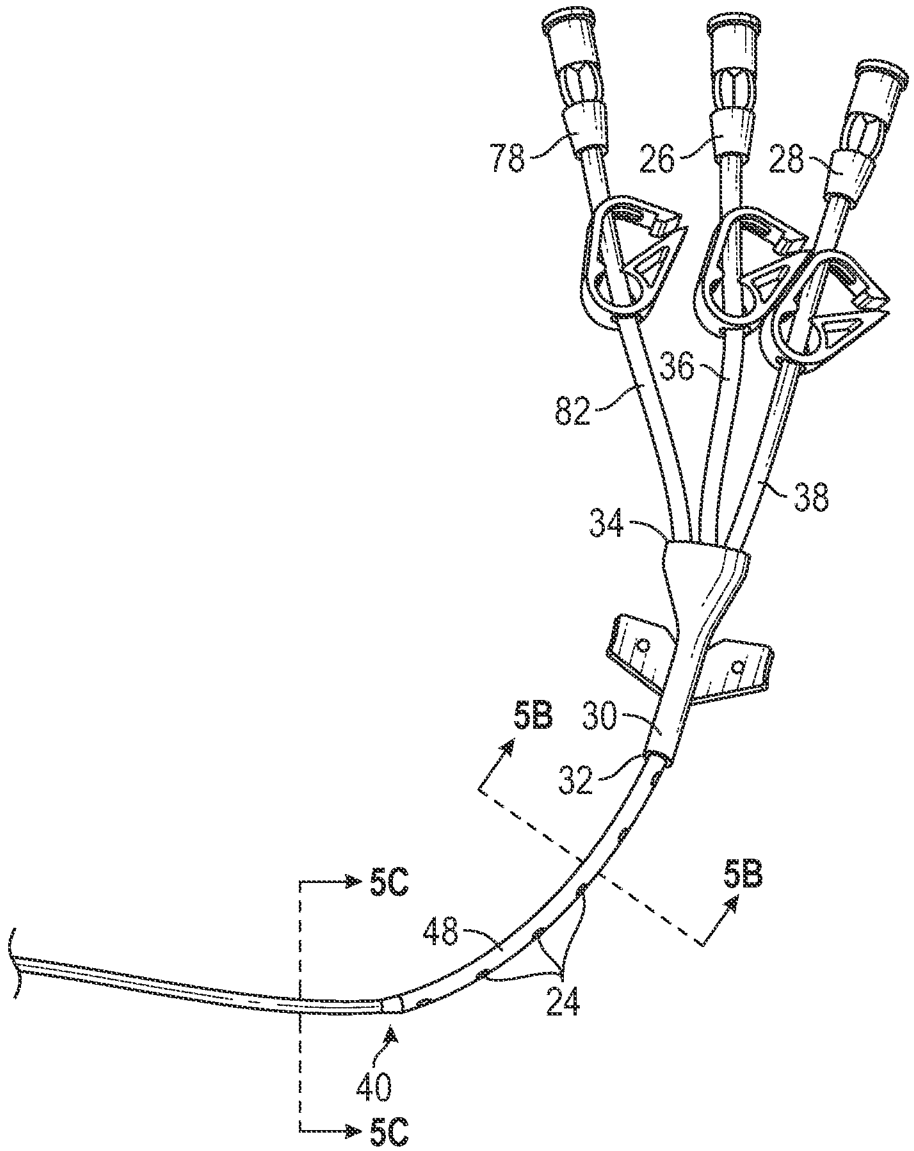
FIG. 5A is an upper perspective view of another example vascular access device, according to some embodiments.
Figure 5B:
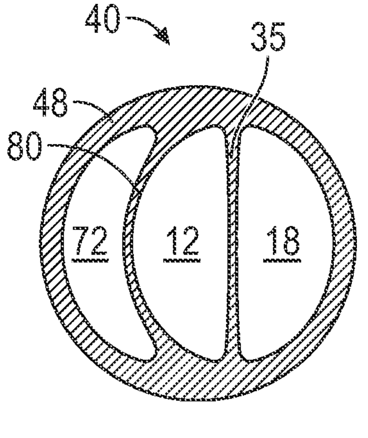
FIG. 5B is a cross-sectional view of the vascular access device of FIG. 5A along a line 5B-5B of FIG. 5A, according to some embodiments.
Figure 5C:
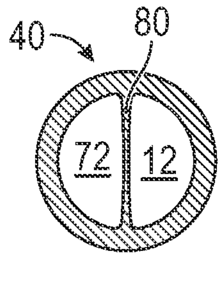
FIG. 5C is a cross-sectional view of the vascular access device of FIG. 5A along a line 5C-5C of FIG. 5A, according to some embodiments.
Figure 5D:
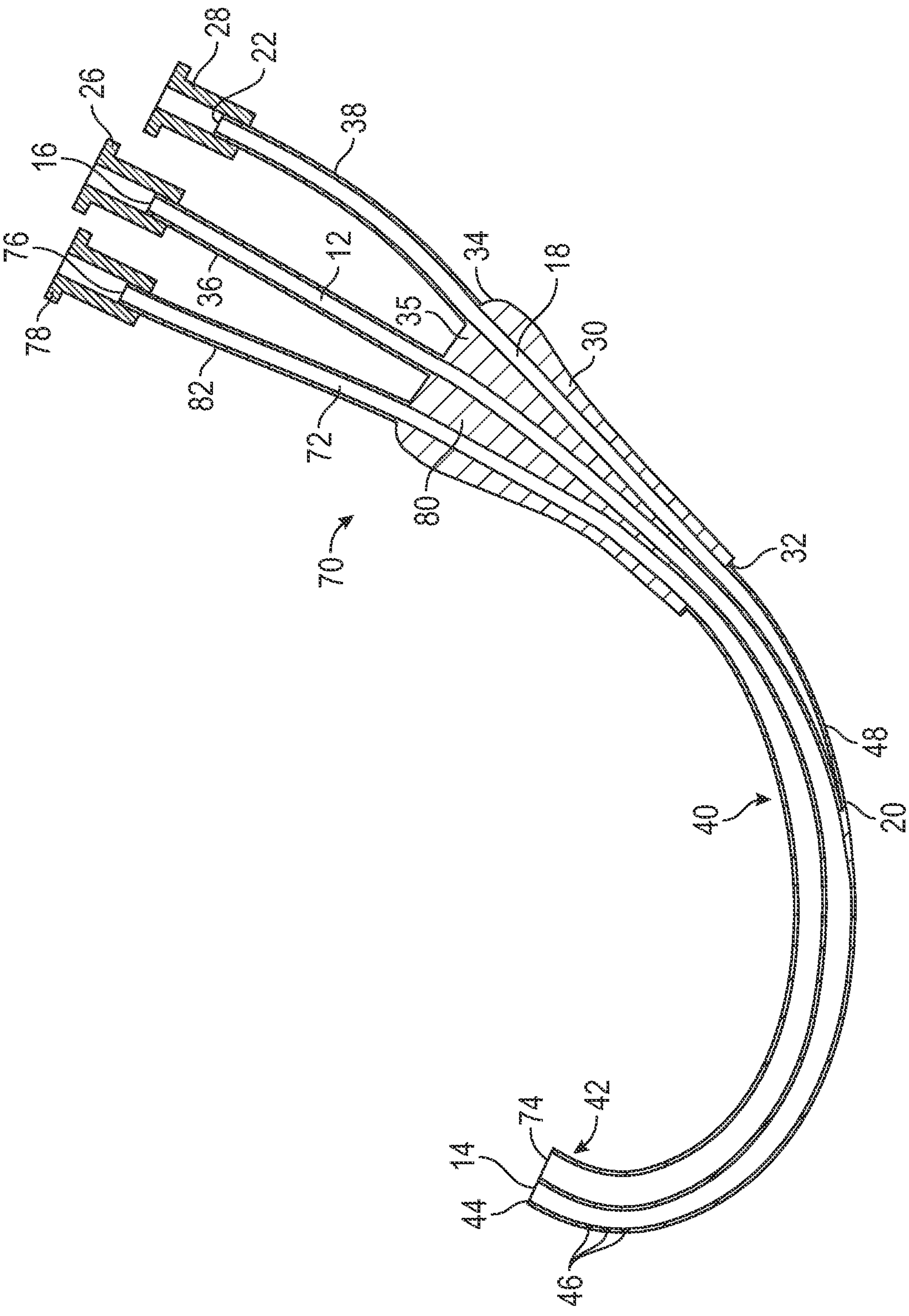
FIG. 5D is a cross-sectional view of the vascular access device of FIG. 5A, according to some embodiments.
Figure 5E:
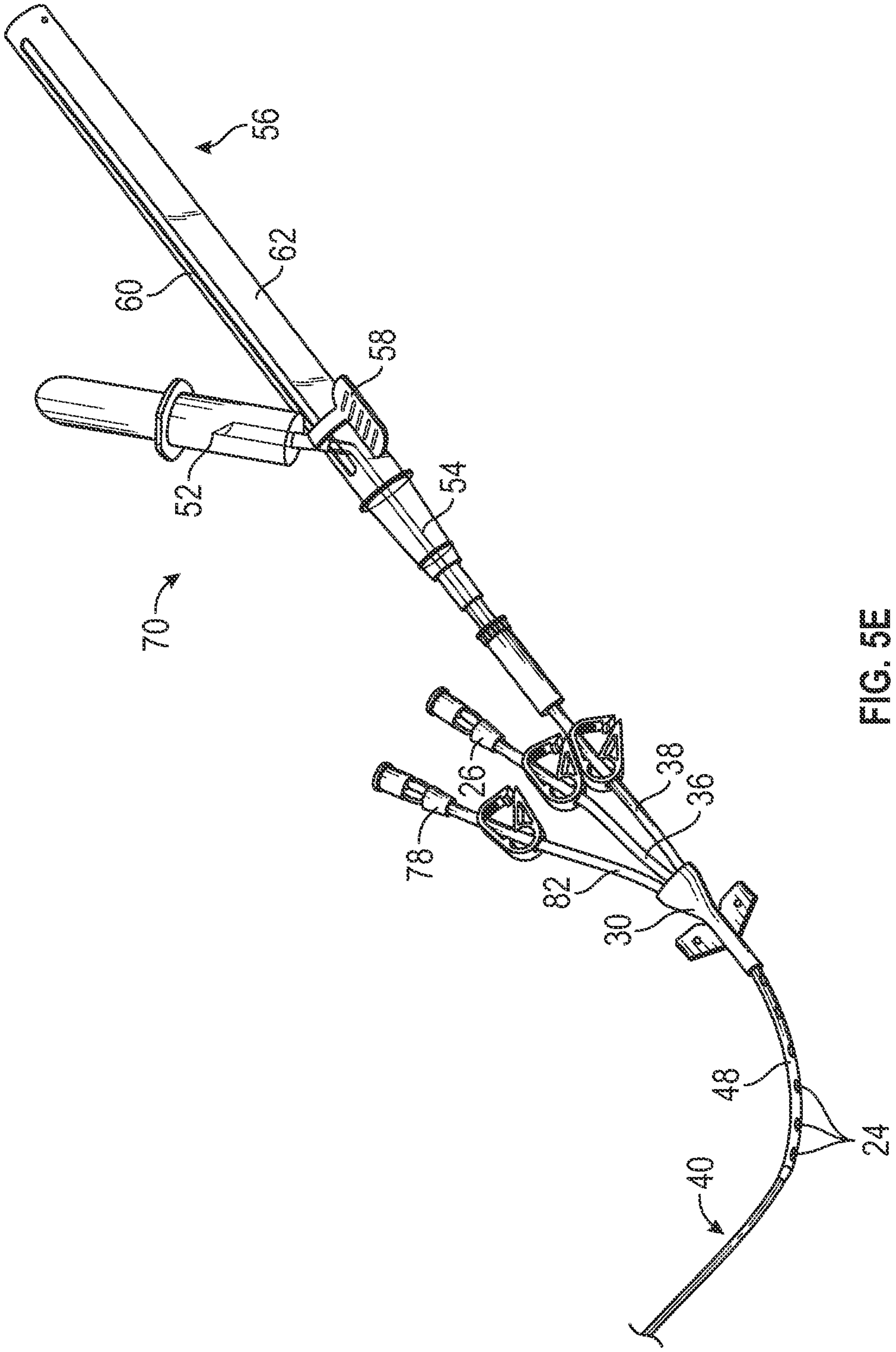
FIG. 5E is an upper perspective view of the vascular access device of FIG. 5A, according to some embodiments.

In some embodiments, the valve 68 may prevent blood from entering the second lumen 18, which may reduce a risk of infection. In some embodiments, the valve 68 may include a slit valve. In these and other embodiments, the valve 68 may be bi-directional. In some embodiments, the valve 68 may open outwardly in response to positive pressure and/or inwardly in response to negative pressure. In some embodiments, the proximal portion 48 of the catheter may include multiple valves 68. Referring now to FIGS. 4D-4E, in some embodiments, the valve 68 may be configured to open in response to a predetermined pressure differential. In some embodiments, the valve 68 may open in response to coupling of the evacuated blood collection tube to a vascular access device, such as, for example, the vascular access device 10, the vascular access device 64, or the vascular access device 66.

Referring now to FIGS. 5A-5E, a vascular access device 70 is illustrated, according to some embodiments. In some embodiments, the vascular access device 70 may be similar or identical in terms of one or more features and/or operation to one or more of the following: the vascular access device 10 of FIGS. 1A-1G, the vascular access device 64 of FIGS. 2A-2D, and the vascular access device 66 of FIGS. 3A-3E. In some embodiments, the vascular access device 70 may include more than two lumens extending there through. In some embodiments, the vascular access device 70 may include a third lumen 72, which may include a distal end 74 and a proximal end 76. In some embodiments, the distal end 74 of the second lumen 18 may be proximal to the distal end 14 of the first lumen 12 and the distal end 74 of the third lumen 72. In some embodiments, the vascular access device 70 may include a third connector 78 disposed at the proximal end 76 of the third lumen 72. In some embodiments, the first lumen 12, the second lumen 18, and the third lumen 72 may be side by side or arranged in various configurations with respect to each other. In some embodiments, the method may include infusing another fluid into the vasculature through the third lumen 72 at a same time as infusing the fluid into the vasculature through the first lumen 12 and collecting the blood from the vasculature through the second lumen 18.

In some embodiments, the divider 35 may be a first divider. In some embodiments, the vascular access device 70 may include a second divider 80, which may extend between the distal end 32 of the catheter adapter 30 and the proximal end 34 of the catheter adapter 30. In some embodiments, the first divider and/or the second divider 80 may extend through the proximal portion 48 of the catheter 40. In some embodiments, the second divider 80 may extend through the distal end 42 of the catheter 40 and may separate the first lumen 12 and the third lumen 72 within a distal portion of the catheter 40. In some embodiments, the first divider and the second divider 80 may separate the first lumen 12, the second lumen 18, and the third lumen 72 within the catheter adapter 30 and/or the proximal portion 48 of the catheter 40. In some embodiments, the vascular access device 70 may include a third extension tube 82, which may extend from the proximal end 34 of the catheter adapter 30 to the third connector 78. In some embodiments, the third extension tube 82 and an entire length of the catheter 40 may include the third lumen 72. In some embodiments, a needleless access connector (not illustrated) may be coupled to the third connector 78 and/or disposed between the delivery device 56 and the third connector 78.

All examples and conditional language recited herein are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

The invention claimed is:

1. A vascular access device, comprising:

a first lumen, comprising a distal end and a proximal end;

a second lumen, comprising a distal end and a proximal end, wherein the distal end of the second lumen is proximal to the distal end of the first lumen;

a first connector disposed at the proximal end of the first lumen;

a second connector disposed at the proximal end of the second lumen;

a catheter adapter comprising a distal end and a proximal end; and a catheter extending distally from the catheter adapter, the catheter comprising a distal end and a proximal end and defining at least a portion of the first lumen and a portion of the second lumen, with the catheter having a tubular shape along an entire length thereof extending between the distal end and the proximal end;

wherein the catheter includes a plurality of openings formed therein in fluid communication with the second lumen, the plurality of openings being spaced apart along a longitudinal axis of the catheter and extending between the distal end of the catheter adapter and the distal end of the second lumen; and wherein the catheter includes a distal opening and one or more side holes formed therein in fluid communication with the first lumen, the distal opening and the one or more side holes formed in the catheter at a location distal from the distal end of the second lumen.

2. The vascular access device of claim 1, wherein portions of the first lumen and the second lumen positioned within the catheter adapter are concentric.

3. The vascular access device of claim 1, wherein the first lumen and the second lumen are side by side.

4. The vascular access device of claim 1, wherein the catheter adapter comprises a divider extending between the distal end of the catheter adapter and the proximal end of the catheter adapter, wherein the divider separates the first lumen and the second lumen within the catheter adapter, and wherein the vascular access device comprises:

a first extension tube extending from the proximal end of the catheter adapter to the first connector; and a second extension tube extending from the proximal end of the catheter adapter to the second connector;

wherein the first extension tube and an entire length of the catheter comprise the first lumen, wherein the second extension tube and a proximal portion of the catheter comprise the second lumen, and wherein the divider extends through the proximal portion of the catheter.

5. The vascular access device of claim 4, wherein the first lumen and the second lumen within the catheter adapter and the proximal portion are concentric, and the divider is tubular.

6. The vascular access device of claim 4, further comprising a plurality of side holes within a distal end of the catheter.

7. The vascular access device of claim 4, wherein portions of the first lumen and the second lumen are side by side within the catheter adapter and the proximal portion of the catheter.

8. The vascular access device of claim 1, further comprising a blood collection device coupled to the second connector, wherein the blood collection device comprises an instrument extending through the second lumen and out through an opening or valve positioned adjacent to the distal end of the second lumen.

9. The vascular access device of claim 1, wherein the plurality of openings provide fluid communication between the second lumen and a vasculature of a patient.

10. The vascular access device of claim 1, further comprising:
- a third lumen, comprising a distal end and a proximal end, wherein the distal end of the second lumen is proximal to the distal end of the first lumen and the distal end of the third lumen; and
- a third connector disposed at the proximal end of the third lumen.

11. The vascular access device of claim 10, wherein the first lumen, the second lumen, and the third lumen are side by side.

12. The vascular access device of claim 10, wherein the vascular access device comprises:
- a third extension tube extending from the proximal end of the catheter adapter to the third connector; and
- wherein the third extension tube and an entire length of the catheter comprise the third lumen.

13. A method, comprising:
- inserting the vascular access device of claim 1 into a vasculature of a patient;
- collecting blood from the vasculature through the second lumen; and
- infusing fluid into the vasculature through the first lumen at a same time as collecting the blood from the vasculature through the second lumen.

14. The method of claim 13, wherein collecting the blood from the vasculature through the second lumen comprises coupling an evacuated blood collection container to the second connector.

15. The method of claim 13, wherein collecting blood comprises coupling a blood collection device to the second connector, wherein the blood collection device comprises a tube, and wherein coupling the blood collection device to the second connector comprises inserting the tube through the second lumen and out an opening of the plurality of openings.

16. The method of claim 13, wherein the vascular access device further comprises:
- a third lumen, wherein the third lumen comprises a distal end and a proximal end, and wherein the distal end of the second lumen is proximal to the distal end of the third lumen; and
- a third connector disposed at the proximal end of the third lumen; and
- the method further comprises infusing another fluid into the vasculature through the third lumen at a same time as infusing the fluid into the vasculature through the first lumen and collecting the blood from the vasculature through the second lumen.

17. The method of claim 14, wherein the vascular access device comprises:
- a first extension tube extending from the proximal end of the catheter adapter to the first connector;
- a second extension tube extending from the proximal end of the catheter adapter to the second connector;
- wherein the first extension tube and an entire length of the catheter comprise the first lumen; and
- wherein the second extension tube and a proximal portion of the catheter comprise the second lumen, wherein the divider extends through the proximal portion of the catheter.

18. The vascular access device of claim 1, wherein the plurality of openings provide for collection of blood from a vasculature of a patient through the second lumen and at various longitudinal locations along the second lumen, and wherein the distal opening and the one or more side holes provide for infusing a fluid into the vasculature of the patient through the first lumen, the fluid comprising one of a saline solution, a medicament, or a total parenteral nutrition.

19. The vascular access device of claim 18, wherein the catheter enables infusing of the fluid into the vasculature of the patient through the first lumen at a same time as collecting blood from the vasculature of the patient through the second lumen.

20. The vascular access device of claim 1, wherein the catheter comprises a cylindrical sidewall defining the tubular shape of the catheter, and wherein all of the plurality of openings formed in the catheter in fluid communication with the second lumen are formed in the cylindrical sidewall.

* * * * *